United States Patent
Hiraishi et al.

(10) Patent No.: US 7,777,517 B2
(45) Date of Patent: Aug. 17, 2010

(54) SIGNAL TRANSMISSION CIRCUIT AND CHARACTERISTIC ADJUSTMENT METHOD THEREOF, MEMORY MODULE, AND MANUFACTURING METHOD OF CIRCUIT BOARD

(75) Inventors: Atsushi Hiraishi, Tokyo (JP); Toshio Sugano, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/292,664

(22) Filed: Nov. 24, 2008

(65) Prior Publication Data

US 2009/0140766 A1 Jun. 4, 2009

(30) Foreign Application Priority Data

Nov. 29, 2007 (JP) .............................. 2007-308571

(51) Int. Cl.
*H03K 19/003* (2006.01)
*H03K 17/16* (2006.01)

(52) U.S. Cl. ........................................ 326/30; 365/206

(58) Field of Classification Search .................... 326/26, 326/27, 30, 31, 34; 365/206, 211, 214
See application file for complete search history.

(56) References Cited

U.S. PATENT DOCUMENTS

| 6,307,791 | B1 * | 10/2001 | Otsuka et al. | 365/189.05 |
| 6,839,286 | B2 * | 1/2005 | Cho et al. | 365/189.05 |
| 6,980,020 | B2 * | 12/2005 | Best et al. | 326/30 |

FOREIGN PATENT DOCUMENTS

| JP | 2000-332591 | 11/2000 |
| JP | 2003-223784 | 8/2003 |
| JP | 2005-333222 | 12/2005 |
| JP | 2006-140548 | 6/2006 |

* cited by examiner

*Primary Examiner*—Daniel D Chang
(74) *Attorney, Agent, or Firm*—McGinn IP Law Group, PLLC

(57) ABSTRACT

A signal transmission circuit comprising: first and second transmission lines connected to each other; a first impedance storage circuit storing an impedance of the first transmission line; and a control circuit that outputs match information between an impedance of the second transmission line and the impedance stored in the first impedance storage circuit.

20 Claims, 16 Drawing Sheets

|  |  | IMPEDANCE OF TRANSMISSION LINE 301 | | |
| --- | --- | --- | --- | --- |
|  |  | CASE 1<br>38Ω~42Ω<br>(-15%~-5%) | CASE 2<br>43Ω~47Ω<br>(-5%~+5%) | CASE 3<br>48Ω~52Ω<br>(+5%~+15%) |
| IMPEDANCE OF TRANSMISSION LINE 302 | CASE 1<br>34Ω~37Ω<br>(-15%~-5%) | PATTERN 1<br>40Ω | PATTERN 2<br>42Ω | PATTERN 3<br>44Ω |
|  | CASE 2<br>38Ω~42Ω<br>(-5%~+5%) | PATTERN 4<br>39Ω | PATTERN 5<br>40Ω | PATTERN 6<br>42Ω |
|  | CASE 3<br>43Ω~46Ω<br>(+5%~+15%) | PATTERN 7<br>36.5Ω | PATTERN 8<br>38Ω | PATTERN 9<br>40Ω |

FIG.9

| Term | Data | Bit2 | Bit1 | Bit0 | P0 | P1 | P2 | P3 | P4 | N0 |
|---|---|---|---|---|---|---|---|---|---|---|
| L | L | Don't care | Don't care | Don't care | OFF | OFF | OFF | OFF | OFF | ON |
| L | H | Don't care | Don't care | Don't care | ON | ON | ON | OFF | OFF | OFF |
| H | Don't care | L | L | L | ON | OFF | OFF | OFF | OFF | OFF |
| H | Don't care | L | L | H | ON | OFF | ON | OFF | OFF | OFF |
| H | Don't care | L | H | L | ON | ON | OFF | OFF | OFF | OFF |
| H | Don't care | L | H | H | ON | ON | ON | OFF | OFF | OFF |
| H | Don't care | H | L | L | ON | ON | ON | OFF | OFF | OFF |
| H | Don't care | H | L | H | ON | ON | ON | OFF | ON | OFF |
| H | Don't care | H | H | L | ON | ON | ON | ON | OFF | OFF |
| H | Don't care | H | H | H | ON | ON | ON | ON | ON | OFF |

FIG.14

SIGNAL TRANSMISSION CIRCUIT AND CHARACTERISTIC ADJUSTMENT METHOD THEREOF, MEMORY MODULE, AND MANUFACTURING METHOD OF CIRCUIT BOARD

BACKGROUND OF THE INVENTION

1. Field of the Invention

The present invention relates to a signal transmission circuit and a characteristic adjustment method thereof, and, more particularly relates to a signal transmission circuit capable of detecting an impedance mismatch between transmission lines and a characteristic adjustment method thereof. The present invention also relates to a memory module, and, more particularly relates to a memory module capable of reading an impedance of a transmission line. The present invention also relates to a manufacturing method of a circuit board, and, more particularly relates to a manufacturing method of a circuit board capable of reading an impedance of a transmission line.

2. Description of Related Art

In information processing systems such as a personal computer and a server, a mother board has mounted thereon a large number of semiconductor chips including not only control system chips such as a CPU (Central Processing Unit) and a memory controller but also semiconductor memories represented by a DRAM (Dynamic Random Access Memory). Among these semiconductor chips, generally, a DRAM is mounted in a memory module called a DIMM (Dual Inline Memory Module), which is mounted on a mother board via a socket.

In recent years, a data transfer rate between a memory controller and a DRAM is increasingly accelerated. When the data transfer rate is accelerated, deterioration in signal quality becomes conspicuous, and thus presently, an impedance adjustment function of an output buffer, an ODT (On Die Termination) function or the like are mounted on the DRAM to inhibit the deterioration in signal quality. Regarding the impedance adjustment function of an output buffer, the ODT function or the like, those described in Japanese Patent Application Laid-open Nos. 2000-332591, 2003-223784, 2005-333222, and 2006-140548 are known.

However, a further accelerated data transfer rate has been recently requested. For example, a data transfer rate of about 3.2 Gbps is demanded. When the data transfer rate is increased to about 3.2 Gbps, the deterioration in signal quality becomes more conspicuous, and as a result, reflection noise resulting from an impedance mismatch between the transmission lines cannot be ignored.

Such an impedance mismatch is mainly a problem between the transmission lines formed on the mother board and that formed on the memory module. The impedance mismatch is generated due to the fact that a predetermined acceptable range is allowed in the impedance of the transmission line in consideration of production variation or the like. Generally, the acceptable range of the impedance is set to about ±15%.

FIG. 15 is a graph for explaining deterioration in signal quality resulting from the impedance mismatch, and shows a signal quality of a case that a memory controller 10 shown in FIG. 16 writes data to a DRAM 21.

As shown in FIG. 16, the memory controller 10 is connected to a signal line 31, and the DRAM 21 is connected to a signal line 32. The signal line 31 is formed on a mother board, and the signal line 32 is formed on a memory module. The signal lines 31 and 32 are connected to each other via a connector 40. The memory module also has another DRAM 22 mounted therein; however, this DRAM 22 is a non-selected one.

In FIG. 15, the X-axis indicates a termination resistance value of the non-selected DRAM 22 (Off Rank DRAM), and the Y-axis indicates amplitude (Eye Height) of write data inputted to the DRAM 21 (On Rank DRAM) that is a write target. More specifically, the Eye Height indicated on the Y-axis represents the amplitude of a signal supplied to an input buffer of the DRAM 21.

The termination resistance value of the DRAM 22 is set to 40 Ω, for example, by the ODT function. However, the termination resistance value also has a variation to some degree by a temperature change, a power voltage fluctuation or the like. In this example, the fluctuation of the termination resistance value resulting from a temperature change, a power voltage fluctuation or the like is estimated at ±15%. The larger the Eye Height, the more preferable. In this case, the minimum acceptable value is set to 200 mV.

A characteristic A shown in FIG. 15 indicates a case that the impedance of the transmission line 31 matches a design value (=Zmp), and the impedance of the transmission line 32 also matches a design value (=Zdp). In this case, when the termination resistance value of the DRAM 22 is a design value (=40 Ω), the Eye Height has a maximum value. Eye Height gradually decreases as the termination resistance value of the DRAM 22 moves farther away from 40 Ω. Even so, in a range of ±15% that is a fluctuation width of the termination resistance value, Eye Height still obtains a sufficiently large value. Thus, a sufficient margin for the temperature change, the power voltage fluctuation or the like is secured.

On the contrary, a characteristic B shown in FIG. 15 indicates a case that the impedance of the transmission line 31 is a minimum value (=Zmn) within an acceptable range and that of the transmission line 32 is a maximum value (=Zdx) within an acceptable range. Accordingly, when the acceptable range of the impedance is ±15%, Zmn=Zmp×0.85 and Zdx=Zdp× 1.15. Thus, in total, an impedance mismatch of about 30% is generated.

In this case, it is understood that Eye Height of a case that the termination resistance value of the DRAM 22 is a design value (=40 Ω) is more decreased than a characteristic A. In this case, when the termination resistance value is about 36.5 Ω that is lower than the design value, the Eye Height has a maximum value and decreases as the termination resistance value moves farther away from 36.5 Ω. Thus, when the termination resistance value of the DRAM 22 is high, Eye Height is greatly reduced, and when the termination resistance value is higher by 15% than the design value, Eye Height decreases to near the minimum acceptable value (=200 mV). Thus, in this case, when the termination resistance value of the DRAM 22 is high, the margin of Eye Height is greatly decreased.

On the other hand, a characteristic C shown in FIG. 15 indicates a case that the impedance of the transmission line 31 is the maximum value (=Zmx) within the acceptable range, and that of the transmission line 32 is the minimum value (=Zdn) within an acceptable range. Accordingly, when an acceptable width of the impedance is ±15%, Zmx=Zmp×1.15 and Zdn=Zdp×0.85. Thus, in total, an impedance mismatch of about 30% is generated.

Also in this case, Eye Height of a case that the termination resistance value of the DRAM 22 is a design value (=40 Ω) is more decreased than the characteristic A. In this case, when the termination resistance value is about 44 Ω that is higher than the design value, Eye Height has a maximum value and decreases as the termination resistance value moves farther away from 44 Ω. Thus, when the termination resistance value of the DRAM 22 is low, Eye Height is greatly reduced, and when the termination resistance value is lower by 15% than the design value, Eye Height decreases to near the minimum acceptable value (=200 mV). Thus, in this case, when the termination resistance value of the DRAM 22 is low, the margin of Eye Height is greatly decreased.

As described above, when the impedance mismatch is present between the transmission lines, the signal quality is deteriorated. As a result, there is a problem that the margin for the temperature change, the power voltage fluctuation or the like is decreased.

To solve such a problem fundamentally, it is necessary to enhance a design precision/fabrication precision of a mother board or a memory module so that the impedance mismatch does not occur in the first place. However, in this case, a decrease in manufacture yield of the mother board or the memory module and a significant price increase is inevitable, and hence, not realistic as a solution. To solve this problem, there is demanded a technique capable of recognizing the presence of such an impedance mismatch at the time of actual use while accepting the fact that the impedance mismatch is present in reality.

SUMMARY

The present invention seeks to solve one or more of the above problems, or to improve upon those problems at least in part.

In one embodiment, there is provided a signal transmission circuit that includes: first and second transmission lines connected to each other; a first impedance storage circuit storing an impedance of the first transmission line; and a control circuit that outputs match information between an impedance of the second transmission line and the impedance stored in the first impedance storage circuit.

According to the present invention, it is possible to detect an impedance mismatch between a first transmission line and a second transmission line.

A countermeasure when the impedance mismatch is detected is not particularly limited. However, it is preferable to change a circuit characteristic of the input/output circuit of the semiconductor chip connected on the signal path. Thereby, it is possible to inhibit deterioration in signal quality resulting from the impedance mismatch. In particular, when the input/output circuit includes a variable termination resistor circuit, it is more preferable to change the terminal resistance value thereof. According thereto, when the terminal resistance value on the Off Rank side is corrected, it is possible to enhance Eye Height of a signal inputted on the On Rank side.

Alternatively, when the impedance mismatch is detected, it is also preferable to inform a user of the detection. According thereto, it is possible to encourage the user to perform a fundamental improvement such as an exchange of a memory module.

In another embodiment, there is provided a memory module that includes: a module substrate; a plurality of semiconductor memories mounted on the module substrate; a nonvolatile memory in which information about the semiconductor memories are recorded; and a transmission line formed on the module substrate and connected at least to the semiconductor memories, wherein the nonvolatile memory in which information about an impedance of the transmission line are recorded.

According to the present invention, it is possible to read the impedance of the transmission line by a memory controller. Thus, after mounting the memory module on the mother board, it is possible to detect the impedance mismatch between the transmission line formed on the memory module and the transmission line formed on the mother board.

In still another embodiment, there is provided a characteristic adjustment method of a signal transmission circuit which includes first and second transmission lines connected to each other; and a semiconductor chip connected on a signal path including the first and second transmission lines, the characteristic adjustment method comprises: a first step of obtaining impedances of the first and second transmission lines; and a second step of changing a circuit characteristic of an input/output circuit included in the semiconductor chip, based on the impedances obtained at the first step.

According to the present invention, it is possible to inhibit deterioration in signal quality resulting from the impedance mismatch.

In still another embodiment, there is provided a manufacturing method of a circuit board according to the present invention comprises: forming a transmission line and a measurement pattern for measuring an impedance of the transmission line on a substrate; measuring the impedance of the transmission line by using the measurement pattern; and recording the measured impedance in a nonvolatile memory mounted on the substrate.

According to the present invention, at the time of actual use, the impedance of the transmission line can be read.

As described above, according to the present invention, because the impedance mismatch actually occurring can be detected at the time of actual use, an appropriate operation can be taken by a controller or a user himself. Thus, various problems resulting from the impedance mismatch can be solved without causing a decrease in manufacturing yield of a mother board or a memory module, or a significant price increase.

BRIEF DESCRIPTION OF THE DRAWINGS

The above features and advantages of the present invention will be more apparent from the following description of certain preferred embodiments taken in conjunction with the accompanying drawings, in which:

FIG. 3A is a schematic cross-sectional diagram, and FIG. 3B is a schematic plane view;

FIG. 9 is a table showing a relationship between impedances of transmission lines 301 and 302 and a termination resistance value to be set;

FIG. 14 is a truth table showing logical levels of various signals shown in FIG. 13 and a relationship between transistors P0 to P4 and N0 to be turned on;

DETAILED DESCRIPTION OF THE EMBODIMENTS

Preferred embodiments of the present invention will be explained below in detail with reference to the accompanying drawings.

Figure 1:
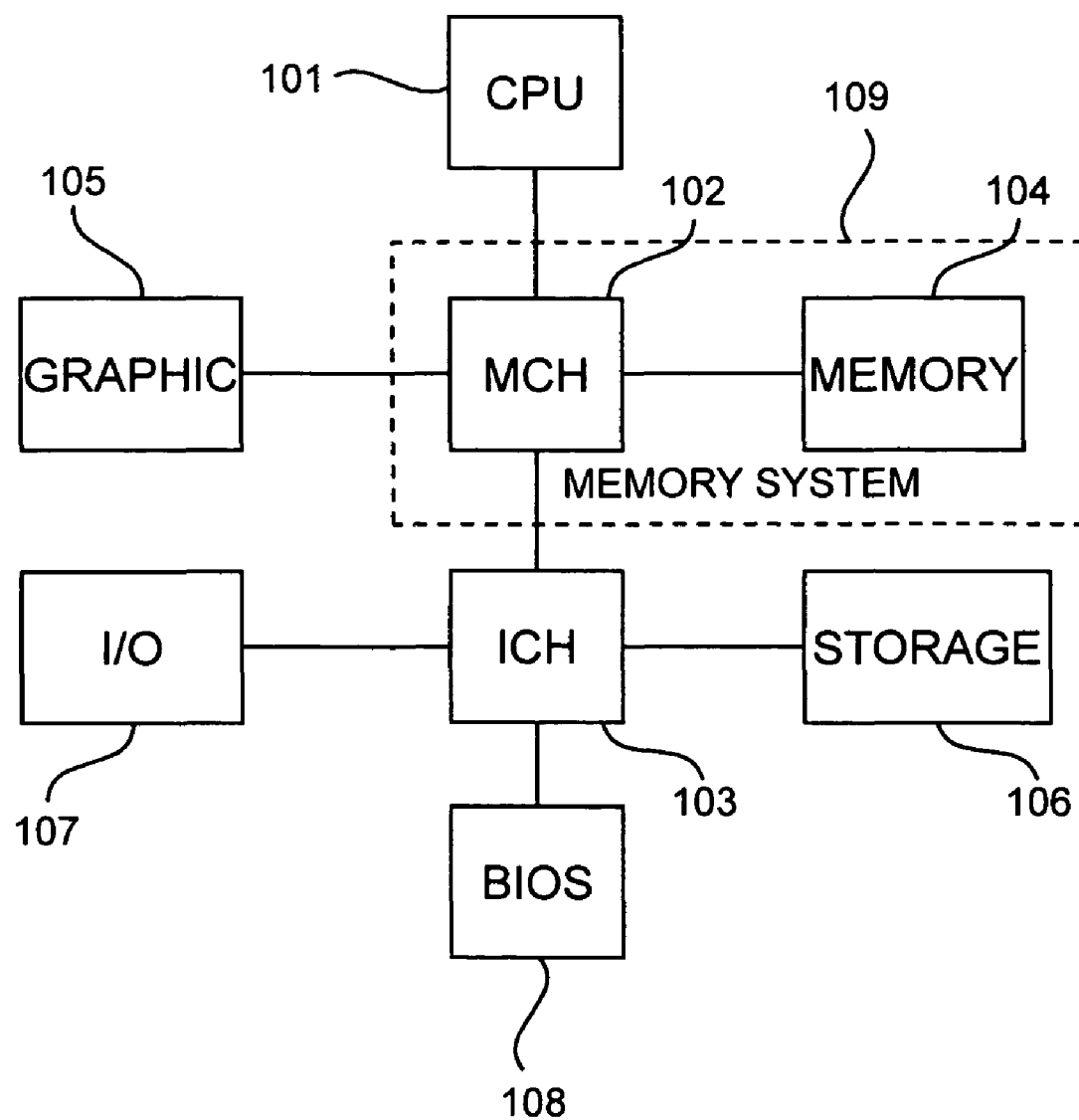
FIG. 1 is a block diagram showing a configuration of an information processing system 100 to which the present invention is preferably applied.

FIG. 1 is a block diagram showing a configuration of an information processing system 100 to which the present invention is preferably applied.

The information processing system 100 shown in FIG. 1 includes a CPU 101 and various devices connected to the CPU 101 via a memory control hub (MCH) 102 and an interface control hub (ICH) 103.

The MCH 102 is connected to a memory module 104 and a graphic controller 105. As described later, the memory module 104 is configured by a DIMM having a plurality of DRAMs mounted thereon. As shown in FIG. 1, the memory module 104 and the MCH 102 configure a memory system 109, and the MCH 102 has a controller function for the memory module 104.

The ICH 103 is connected to a storage device 106, an I/O device 107, and a BIOS (Basic Input/Output System) 108. The storage device 106 includes a magnetic drive such as a hard disk drive or an optical drive such as a CD-ROM drive. The I/O device 107 includes an input device such as a keyboard and a mouse, an output device such as a speaker, and a network device such as a modem and an LAN. The BIOS 108 is a certain type of a firmware having various types of basic information about the information processing system 100 stored therein, and is configured by a nonvolatile memory such as a flash memory.

Among the information processing system 100 having such a configuration, at least semiconductor devices such as the CPU 101, the memory module 104, and the BIOS 108 are mounted on the mother board, and these components are connected to each other via transmission lines formed on the mother board. In the following explanations, attention is paid to the memory system 109 configured by the memory module 104 and the MCH 102.

Figure 2:
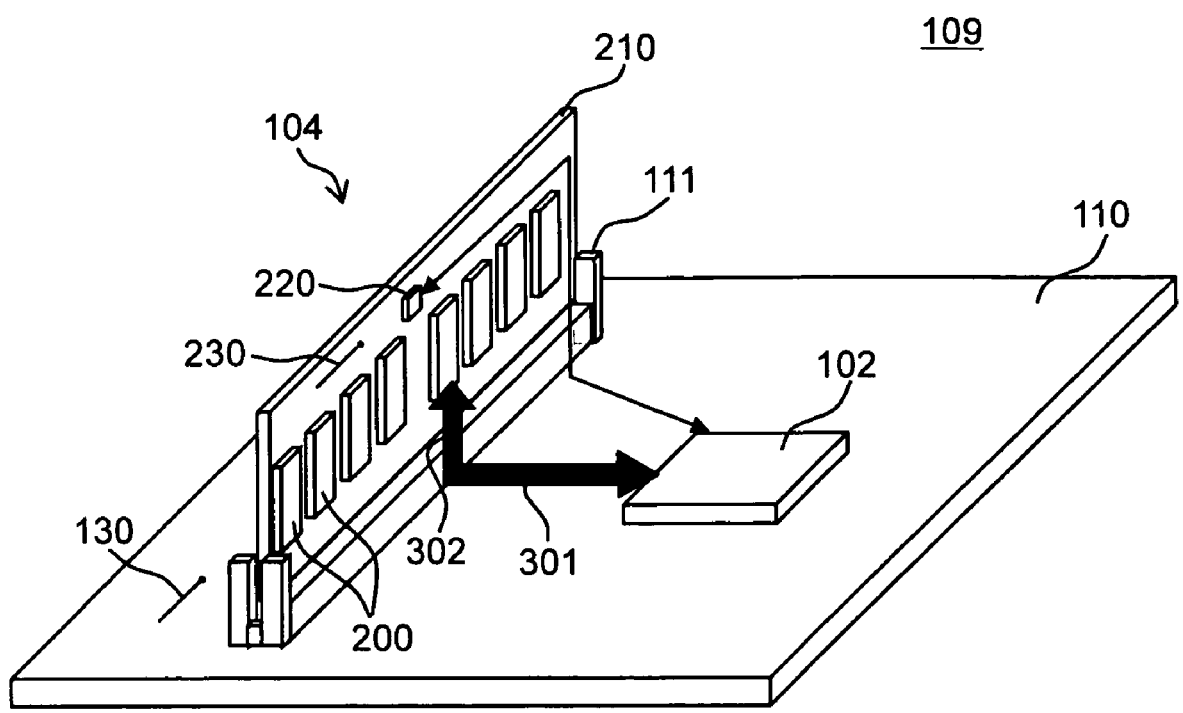
FIG. 2 is a perspective view schematically showing a structure of the mother board in a portion in which the memory system 109 is formed.

FIG. 2 is a perspective view schematically showing a structure of the mother board in a portion in which the memory system 109 is formed.

As shown in FIG. 2, the mother board 110 is arranged with sockets 111. The memory module 104 is inserted in the sockets 111. On the other hand, the MCH 102 is directly mounted on the mother board 110.

The memory module 104 has a configuration in which a plurality of DRAMs 200 are mounted on a module substrate 210. The number of DRAMs 200 to be mounted is not particularly limited.

Each DRAM 200 has a so-called ODT function. In the ODT function, an input/output circuit of a non-selected DRAM (Off Rank DRAM) can be utilized as a terminal resistance. When the DRAM 200 is imparted with the ODT function, a terminal resistor does not need to be arranged outside a semiconductor chip, and thus the number of components can be reduced. In addition, a signal reflection can be more effectively prevented, and thus a signal quality on an external bus can be also improved. It is possible to change an ODT impedance (termination resistance value) by referring to data within a mode register arranged inside each DRAM 200.

As shown in FIG. 2, the module substrate 210 has an SPD (Serial Presence Detect) chip 220 mounted thereon in addition to the DRAMs 200. The SPD chip 220 has various types of information about the memory module 104 such as a memory capacity of the memory module 104 recorded therein, an access speed such as a clock frequency, and an access method as well. For the SPD chip 220, a nonvolatile memory such as an EEPROM is used.

In the present embodiment, in addition to the various types of information, the impedance of a transmission line 302 formed on the memory module 104 is stored in the SPD chip 220. Accordingly, the SPD chip 220 functions as an impedance storage circuit in the present invention.

The module substrate 210 has a measurement pattern 230 formed thereon. The measurement pattern 230 is a pattern for measuring the impedance of the transmission line 302 formed on the memory module 104. Although not particularly limited, the measurement pattern 230 is a pattern capable of measuring an impedance by a TDR (Time Domain Reflectometry) method. The measurement pattern 230 is not a pattern capable of directly measuring the impedance of the transmission line 302. However, the transmission line 302 and the measurement pattern 230 are simultaneously formed at the time of fabricating the module substrate 210 and the both components are sufficiently close to each other. Thus, the impedance measured by using the measurement pattern 230 can be regarded as being substantially matching with the impedance of the transmission line 302. That is, by using the measurement pattern 230, the impedance of the transmission line 302 can be indirectly measured.

On the other hand, as shown in FIG. 2, a measurement pattern 130 is also formed on the mother board 110. The measurement pattern 130 measures the impedance of the transmission line 301 formed on the mother board 110. The measurement pattern 130 also can adopt a pattern capable of measuring an impedance by the TDR method, similar to the measurement pattern 230 arranged on the memory module 104. Accordingly, when the measurement pattern 130 is used, the impedance of the transmission line 301 formed on the mother board 110 can be indirectly measured.

Figure 3A:
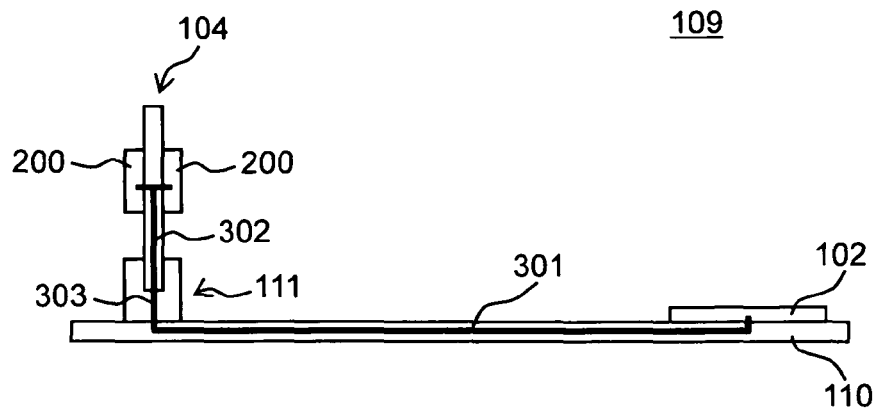
FIGS. 3A and 3B are schematic diagrams each explaining the transmission lines included in the memory system 109.
Figure 3B:
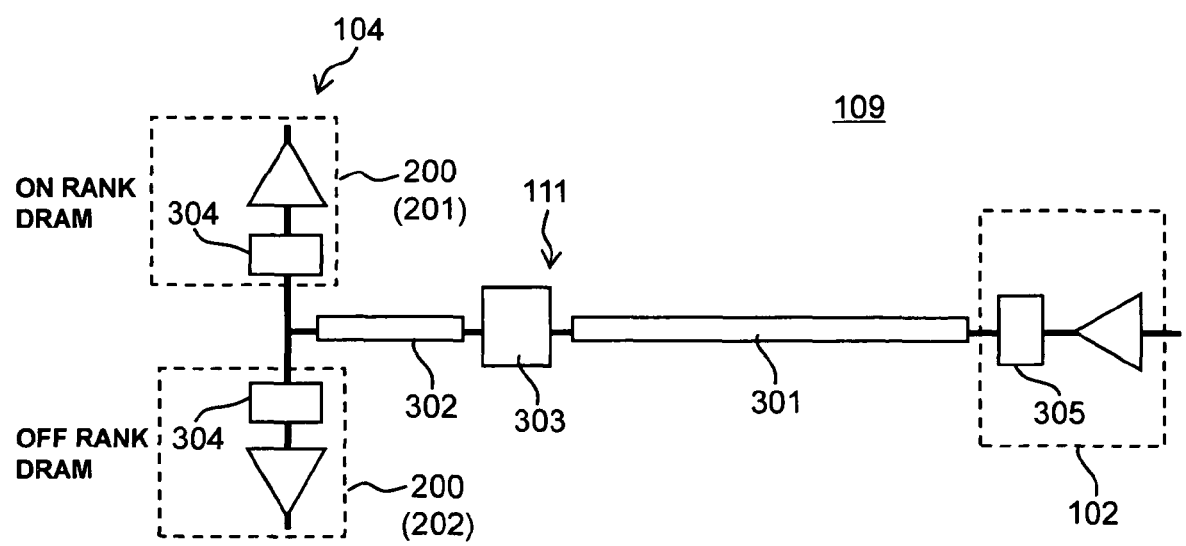

FIGS. 3A and 3B are schematic diagrams each explaining the transmission lines included in the memory system 109. FIG. 3A is a schematic cross-sectional diagram, and FIG. 3B is a schematic plane view.

As shown in FIGS. 3A and 3B, each DRAM 200 mounted on the memory module 104 and the MCH 102 mounted on the mother board 110 are connected on a signal path formed of a plurality of transmission lines. On the signal path, there are the transmission line 301 formed on the mother board 110, the transmission line 302 formed on the memory module 104, and a transmission line 303 formed in the socket 111. Besides, a transmission line 304 formed within a package of each DRAM 200 and a transmission line 305 formed within a package of the MCH 102 are also present.

These transmission lines 301 to 305 are so designed that the impedances are matched to each other. However, as described above, the impedances of the transmission lines are allowed a certain level of acceptable range in consideration of a production variation or the like. Thus, in reality, the impedances of the transmission lines are not necessarily matched correctly. That is, among the transmission lines 301 to 305, an impedance mismatch is probably present, which results in deterioration in signal quality.

The impedance mismatch causing the deterioration in signal quality is mainly generated in the transmission lines 301 and 302. The mismatch is generated mainly in these transmission lines due to the fact that as compared to the other transmission lines 303 to 305, transmission line lengths of the transmission lines 301 and 302 are longer, and thus the signal quality is greatly influenced. In the transmission lines 303 to 305, the fluctuation of the impedances caused by the production variation is small in the first place. On the other hand, in the transmission lines 301 and 302, the production variation is large, and it applies a great influence to the impedance. This fact is one of the causes for the impedance mismatch.

In order that such an impedance mismatch can be detected, in the present embodiment, the impedances of the transmission lines 301 and 302 are stored inside the information processing system 100 shown in FIG. 1.

More specifically, the impedance of the transmission line 301 is stored in the BIOS 108 shown in FIG. 1, and the impedance of the transmission line 302 is stored in the SPD chip 220. Accordingly, when the stored impedances are read at the time of starting the information processing system 100, it is possible to recognize the presence of the impedance mismatch.

The impedances of the transmission lines 301 and 302 are measured by using the measurement patterns 130 and 230, and the measured impedances are recorded in the BIOS 108 and the SPD chip 220, respectively. Such a measurement and recording are performed at the time of manufacturing the mother board 110 or the module substrate 210.

Figure 4:
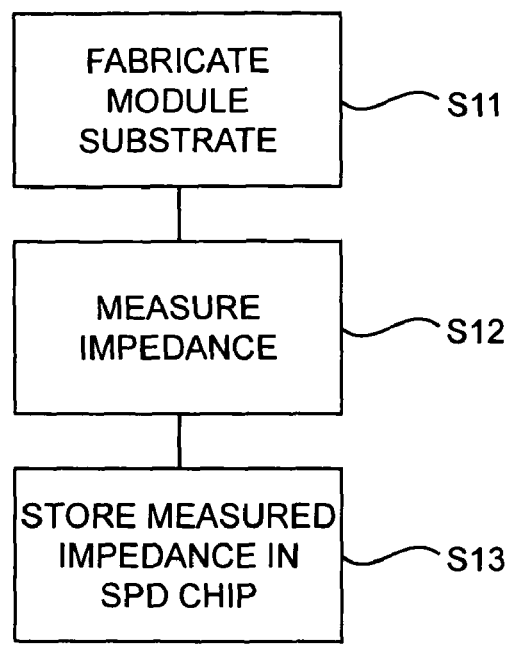
FIG. 4 is a flowchart explaining a method for recording the impedance of the transmission line 302 in the SPD chip 220.

FIG. 4 is a flowchart explaining a method for recording the impedance of the transmission line 302 in the SPD chip 220.

As shown in FIG. 4, the transmission line 302 and the measurement pattern 230 are formed on a multilayer substrate. That is, the module substrate 210 is fabricated (step S11). The transmission line 302 and the measurement pattern 230 are not formed through individual steps. The measurement pattern 230 is formed simultaneously at a step of forming the transmission line 302. Thus, when a distance between the both components is sufficiently close, the impedances of the both components substantially match each other.

Figure 5:
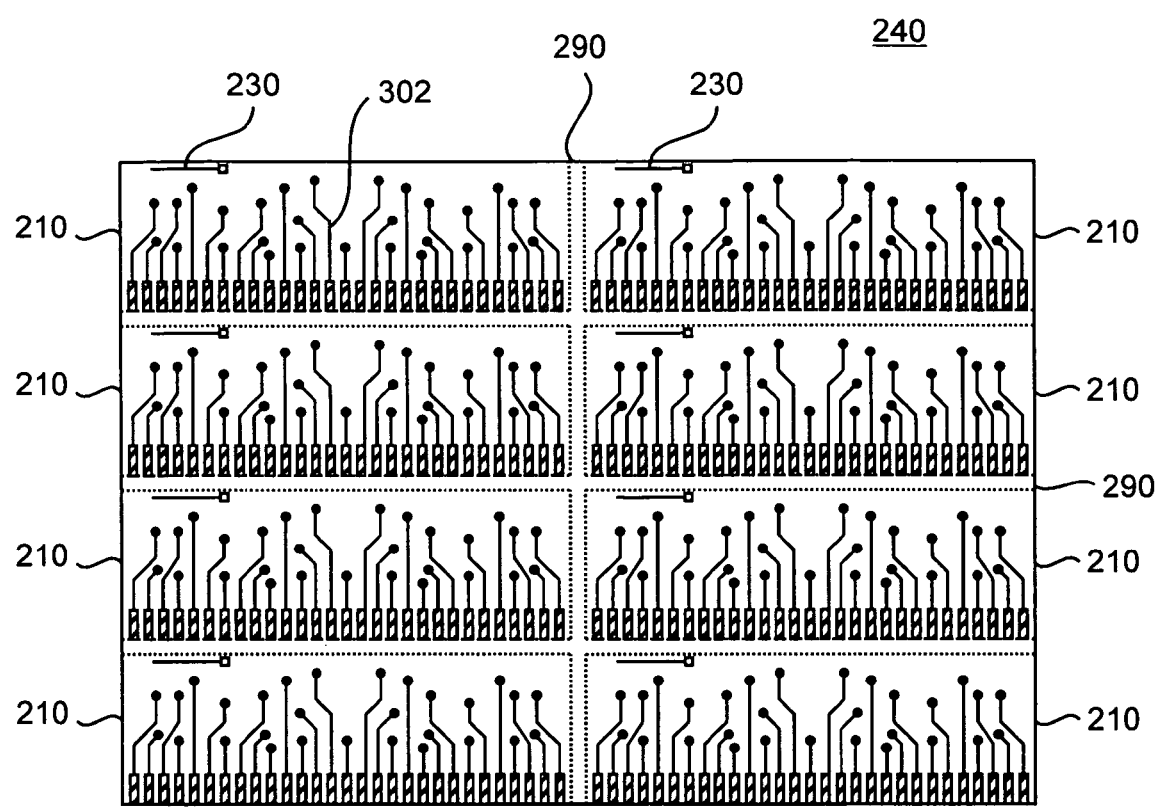
FIG. 5 is a diagram showing a state before a substrate 240 is divided into the individual module substrates 210, wherein a measurement pattern 230 is arranged for each module substrate 210.

In fabricating the module substrate 210, as shown in FIG. 5, a substrate 240 including a plurality of module substrates 210 are normally fabricated first, and thereafter, the substrate 240 is divided into the individual module substrates 210 to obtain a large number thereof. The division into the individual module substrates 210 is performed by cutting along a scribe line 290. The measurement pattern 230 is most preferably arranged for each module substrate 210, as shown in FIG. 5. However, when a distance between the measurement pattern 230 and the transmission line 302 that is a measurement target is sufficiently close, one measurement pattern 230 can be assigned to the module substrates 210.

Figure 6:
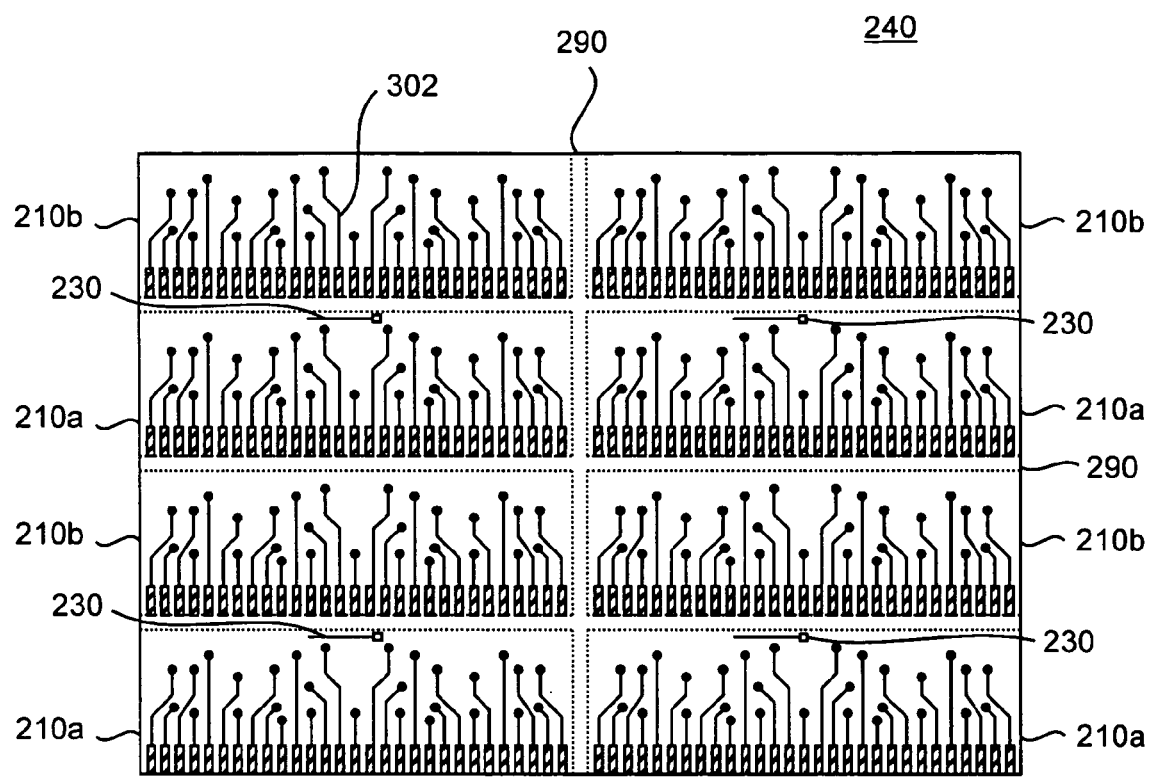
FIG. 6 is a diagram showing a state before a substrate 240 is divided into the individual module substrates 210, wherein one measurement pattern 230 is assigned to two adjacent module substrates 210.

In the example shown in FIG. 6, one measurement pattern 230 is assigned to two adjacent module substrates 210a and 210b. As shown in FIG. 6, planar shapes of the module substrates 210a and 210b are rectangular. Thus, when the measurement pattern 230 is arranged near an end of a long side of each module substrate 210a, the measurement pattern 230 is sufficiently close in distance not only to the transmission line 302 formed on the module substrate 210a but also to the transmission line 302 formed on the module substrate 210b. According to such an arrangement, it is possible to assign one measurement pattern 230 for the two module substrates 210a and 210b.

Figure 7:
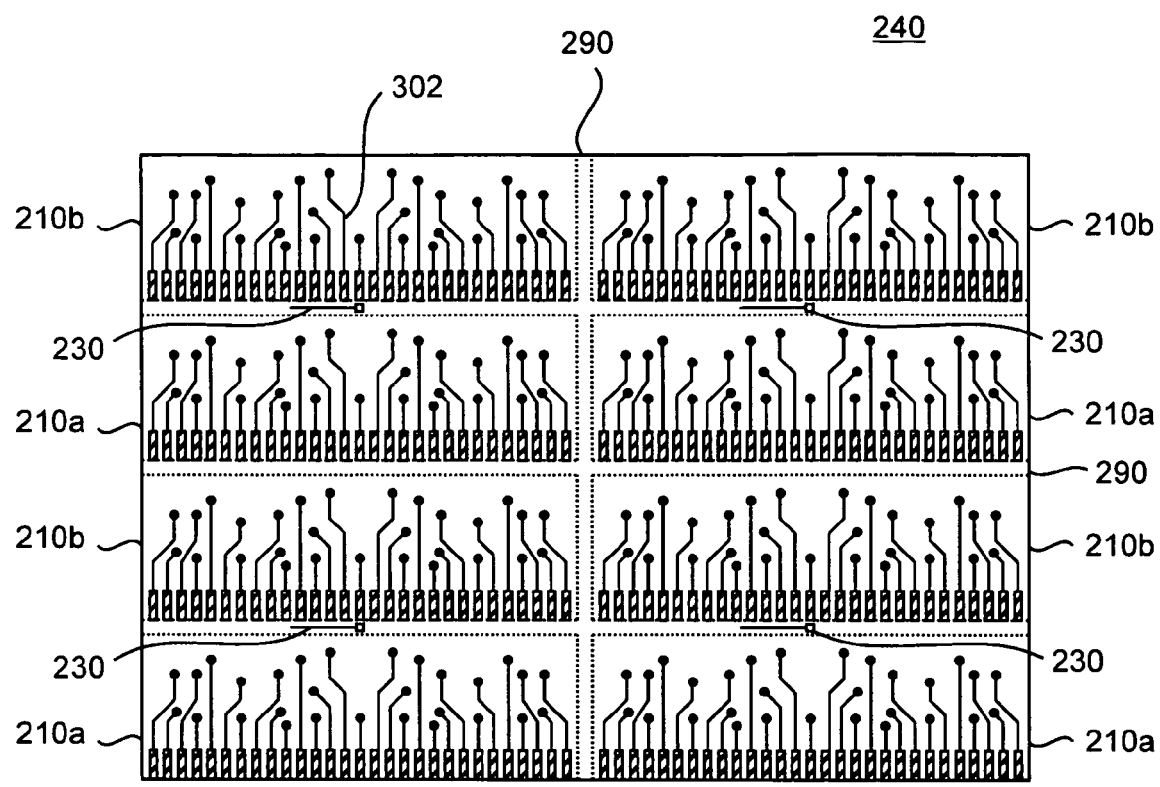
FIG. 7 is a diagram showing a state before a substrate 240 is divided into the individual module substrates 210, wherein one measurement pattern 230 is arranged on a scribe line 290.

In an example shown in FIG. 7, similar to the example shown in FIG. 6, one measurement pattern 230 is assigned to the two adjacent module substrates 210a and 210b, and further, the measurement pattern 230 is arranged on the scribe line 290. According thereto, an occupied area of the measurement pattern 230 on each module substrate can be rendered zero. In this way, it is not necessary that the measurement pattern 230 is left on the module substrate 210 after being manufactured.

Subsequently, the measurement pattern 230 is used to measure the impedance of the transmission line 302 (step S12). More specifically, the TDR method is used to directly measure the impedance of the measurement pattern 230, and the measured value is determined as the impedance of the transmission line 302. That is, by using the measuring pattern 230, the impedance of the transmission line 302 is indirectly measured.

Thereafter, the measured impedance is stored in the corresponding. SPD chip 220 (step S13). Thereby, the impedance of the transmission line 302 is correctly recorded in the SPD chip 220.

As shown in FIG. 5, when the measurement patterns 230 are assigned on the individual module substrates 210, the impedance value obtained at step S12 is recorded in the SPD chip 220 mounted on each module substrate 210. Accordingly, in this case, in the SPD chip 220, the impedance of the transmission line 302 is highly accurately recorded.

On the other hand, as shown in FIG. 6 and FIG. 7, when the same measurement pattern 230 is commonly assigned to a plurality of module substrates 210a and 210b, the impedance value obtained at step S12 is commonly recorded for the corresponding SPD chips 220. Accordingly, in this case, the number of times of impedance measurements using the measurement patterns 230 is decreased, and as a result, the manufacturing efficiency can be enhanced.

Thus, the method for recording the impedance of the transmission line 302 in the SPD chip 220 is described. A method for recording the impedance of the transmission line 301 formed on the mother board 110 in the BIOS 108 can also be performed similar to that described above.

Subsequently, an operation of the information processing system 100 at the time of actual use is described.

Figure 8:
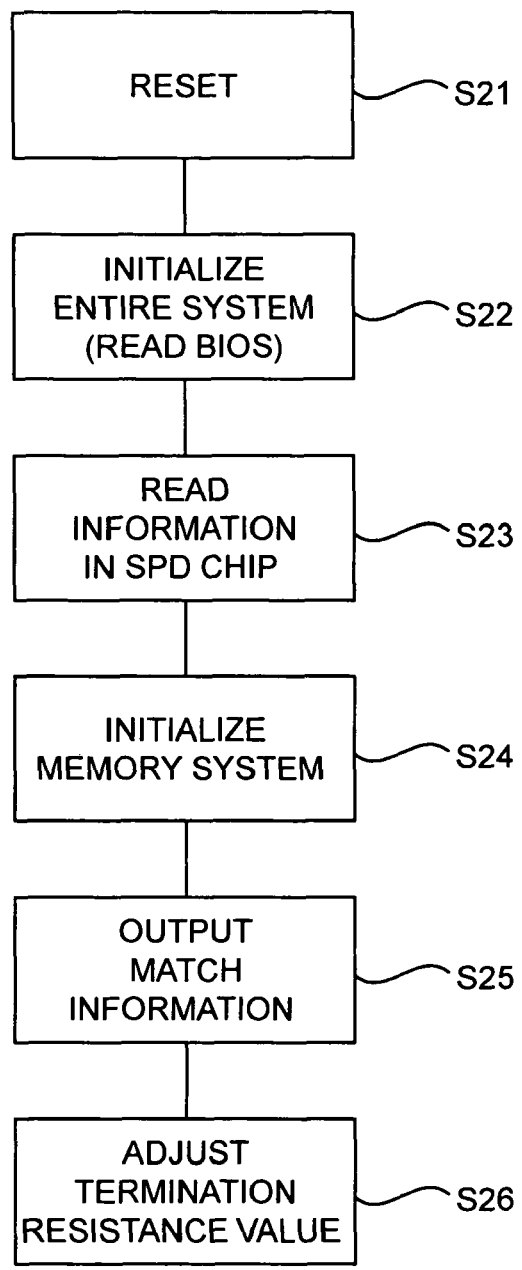
FIG. 8 is a flowchart explaining an operation of an information processing system 100 at the time of resetting.

FIG. 8 is a flowchart explaining the operation of the information processing system 100 at the time of resetting.

As shown in FIG. 8, when the information processing system 100 is reset (step S21), the CPU 101 firstly accesses the BIOS 108 to initialize the system (step S22). As described above, the BIOS 108 has the various types of fundamental information about the information processing system 100 stored therein, and the CPU 101 reads the information to perform various settings or diagnosis of the system. At this time, also the impedance of the transmission line 301 stored in the BIOS 108 is read.

Subsequently, the CPU 101 accesses the SPD chip 220 on the memory module 104 via the MCH 102 to read various types of information stored in the SPD chip 220 (Step S23). At this time, also the impedance of the transmission line 302 stored in the SPD chip 220 is read. Thereafter, the MCH 102 accesses the DRAM 200 on the memory module 104 to initialize the memory system 109 (step S24).

The CPU 101 refers to the read impedances of the transmission lines 301 and 302, and based thereon, supplies match information to the MCH 102 (step S25). The match information indicates a relative relationship between the impedance of the transmission line 301 and that of the transmission line 302, and the data format of the match information is not limited. Accordingly, the match information can be the read impedance value as it is, and can be information indicating a direction of deviation and an amount of deviation from each design value. A signal for executing a mode register set described later also configures the match information.

When such match information is supplied to the MCH 102, the MCH 102 executes the mode register set to each DRAM 200 on the memory module 104 to adjust the termination resistance value (step S26). More specifically, when the impedances of the transmission lines 301 and 302 substantially match each other, the termination resistance value is set according to the design value, and when the impedances of the transmission lines 301 and 302 do not substantially match each other, the termination resistance value is offset relative to the design value. A signal for executing the mode register set is based on the match information supplied from the CPU 101 to the MCH 102, and thus this signal also configures the match information.

FIG. 9 is a table showing a relationship between the impedances of the transmission lines 301 and 302; and the termination resistance value to be set. An example shown in FIG. 9 indicates a case that an impedance design value of the transmission line 301 formed on the mother board 110 is 45 Ω and that of the transmission line 302 formed on the memory module 104 is 40 Ω.

As described above, these impedances are allowed an acceptable range of about ±15% in consideration of a production variation or the like. The example shown in FIG. 9 provides three different cases, i.e., a case that the variation of the impedance is −15% to −5% of the design value (case 1); a case that the same is within ±5% (case 2); and a case that the same is +5% to +15% (case 3). Accordingly, there are nine sets of combination patterns of the impedances of the transmission lines 301 and 302.

Out of these patterns, when both the impedances of the transmission lines 301 and 302 fall under the category of the case 2 (pattern 5), i.e., when both the transmission lines 301 and 302 have the impedances nearly according to the design values, offsetting of the termination resistance value is unnecessary. Accordingly, the termination resistance value is set according to the design value (in this example, 40 Ω).

When both the impedances of the transmission lines 301 and 302 fall under the category of the case 1 (pattern 1), or when both the impedances thereof fall under the category of the case 3 (pattern 9), the termination resistance value is deviated from the design value. Even so, the mismatch of the impedance does not substantially occur. Accordingly, in this case also, offsetting of the termination resistance value is unnecessary, and the termination resistance value is set according to the design value (=40 Ω).

On the contrary, in the other patterns 2 to 4 and 6 to 8, a substantial impedance mismatch occurs between the transmission lines 301 and 302. The degree of the impedance mismatch reaches the maximum (worst) in the pattern 3 and the pattern 7. In the pattern 3, the impedance of the transmission line 301 falls under the category of the case 3 whereas the impedance of the transmission line 302 falls under the category of the case 1. In the pattern 7, the impedance of the transmission line 301 falls under the category of the case 1 whereas the impedance of the transmission line 302 falls under the category of the case 3.

When such an impedance mismatch is detected, the termination resistance value is offset relative to the design value to inhibit the deterioration in signal quality resulting from the impedance mismatch. The offset direction and the offset amount are determined depending on types of impedance mismatches to be occurred. In the example shown in FIG. 9, when the impedance of the transmission line 302 is too high relative to the impedance of the transmission line 301 (patterns 4, 7, and 8), the termination resistance value is set lower than the design value, and contrary thereto, when the impedance of the transmission line 302 is too low relative to the impedance of the transmission line 301 (patterns 2, 3, and 6), the termination resistance value is set higher than the design value.

Subsequently, a case that the MCH 102 shown in FIG. 3B performs a data write to the DRAM 201 is used as an example to describe by using a graph concerning a relationship between the termination resistance value of the DRAM 202, which is an Off Rank DRAM, and the amplitude (Eye Height) of the write data inputted to the DRAM 201, which is an On Rank DRAM.

Figure 10:
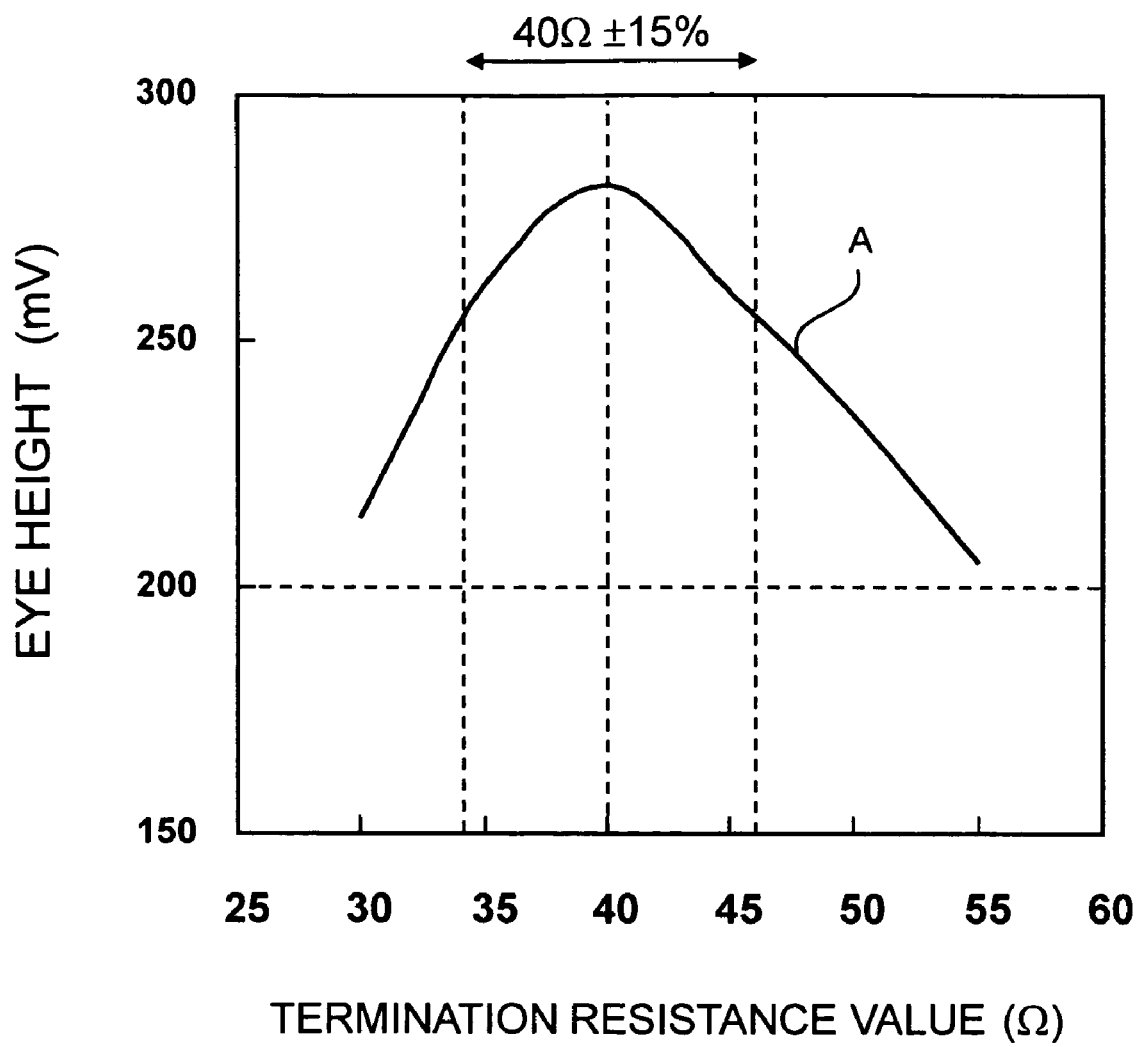
FIG. 10 is a graph showing a relationship between a termination resistance value and Eye Height in a pattern 5.
Figure 15:
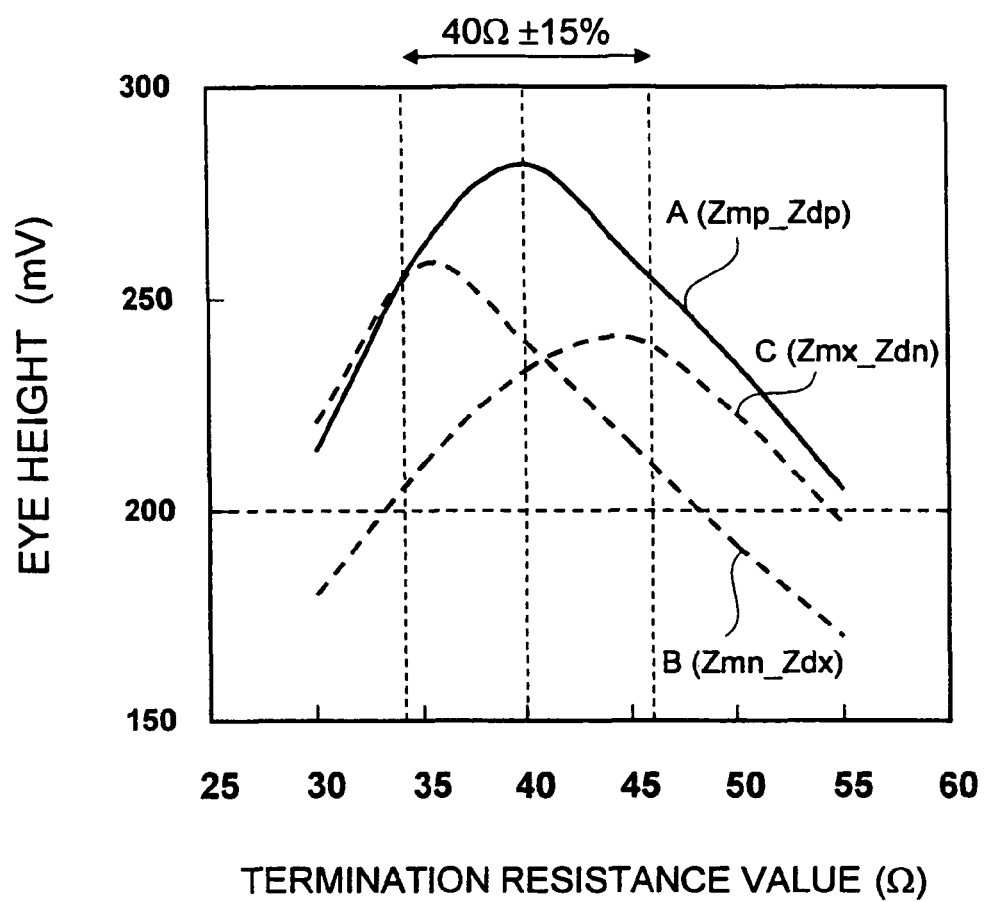
FIG. 15 is a graph for explaining deterioration in signal quality resulting from the impedance mismatch.
Figure 16:
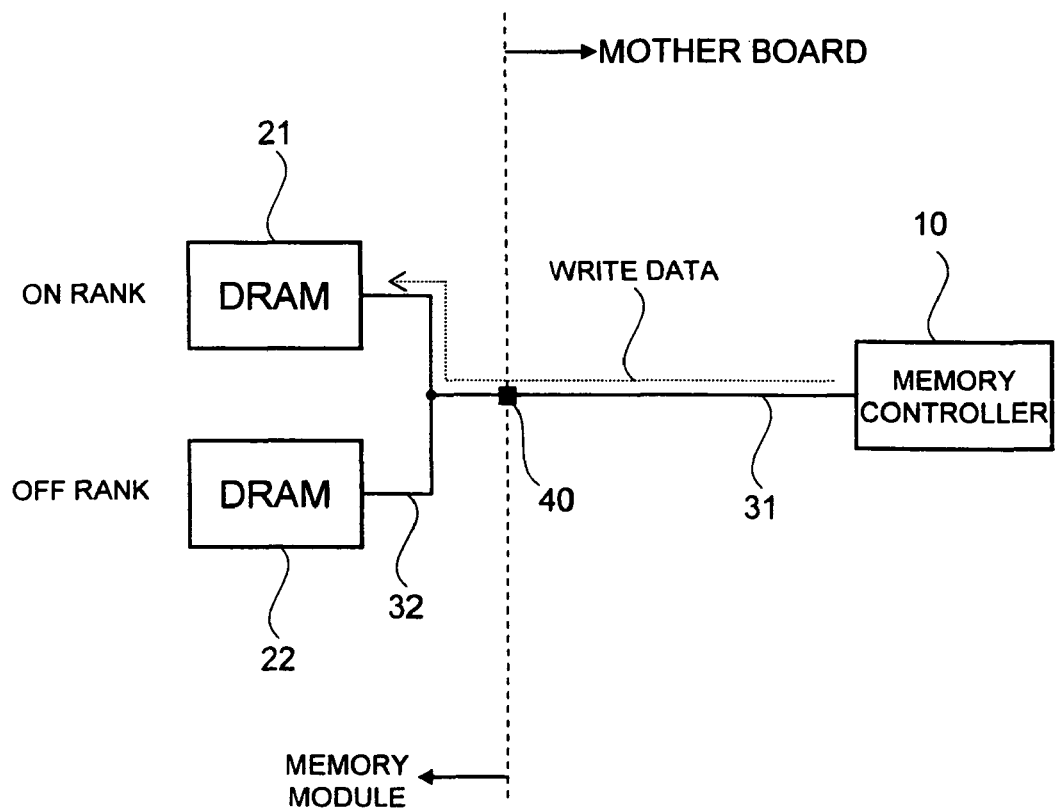
FIG. 16 is a block diagram showing a circuit in which DRAMs 21 and 22 are connected to a memory controller 10.

FIG. 10 is a graph showing a relationship between the termination resistance value and the Eye Height in the pattern 5. In the pattern 5, the transmission lines 301 and 302 have the impedances nearly according to the design value, and the substantial impedance mismatch does not occur. In this case, an obtained characteristic matches the characteristic A shown in FIG. 15.

In such a pattern, the termination resistance value of the DRAM 202 is set according to the design value (=40 Ω). In this pattern, when the termination resistance value of the DRAM 202 is a design value (=40 Ω), the Eye Height reaches the maximum value. Thus, the Eye Height that greatly exceeds 200 mV, which is a sufficient minimum acceptable value, can be secured.

However, as described above, the termination resistance value fluctuates by about ±15% by the temperature change, the power voltage fluctuation or the like. When the termination resistance value moves away from 40 Ω, the Eye Height decreases. However, within a range of ±15%, which is a fluctuation width of the termination resistance value, a sufficiently large value is obtained. As a result, a sufficient margin for the temperature change, the power voltage fluctuation or the like can be secured.

Figure 11:
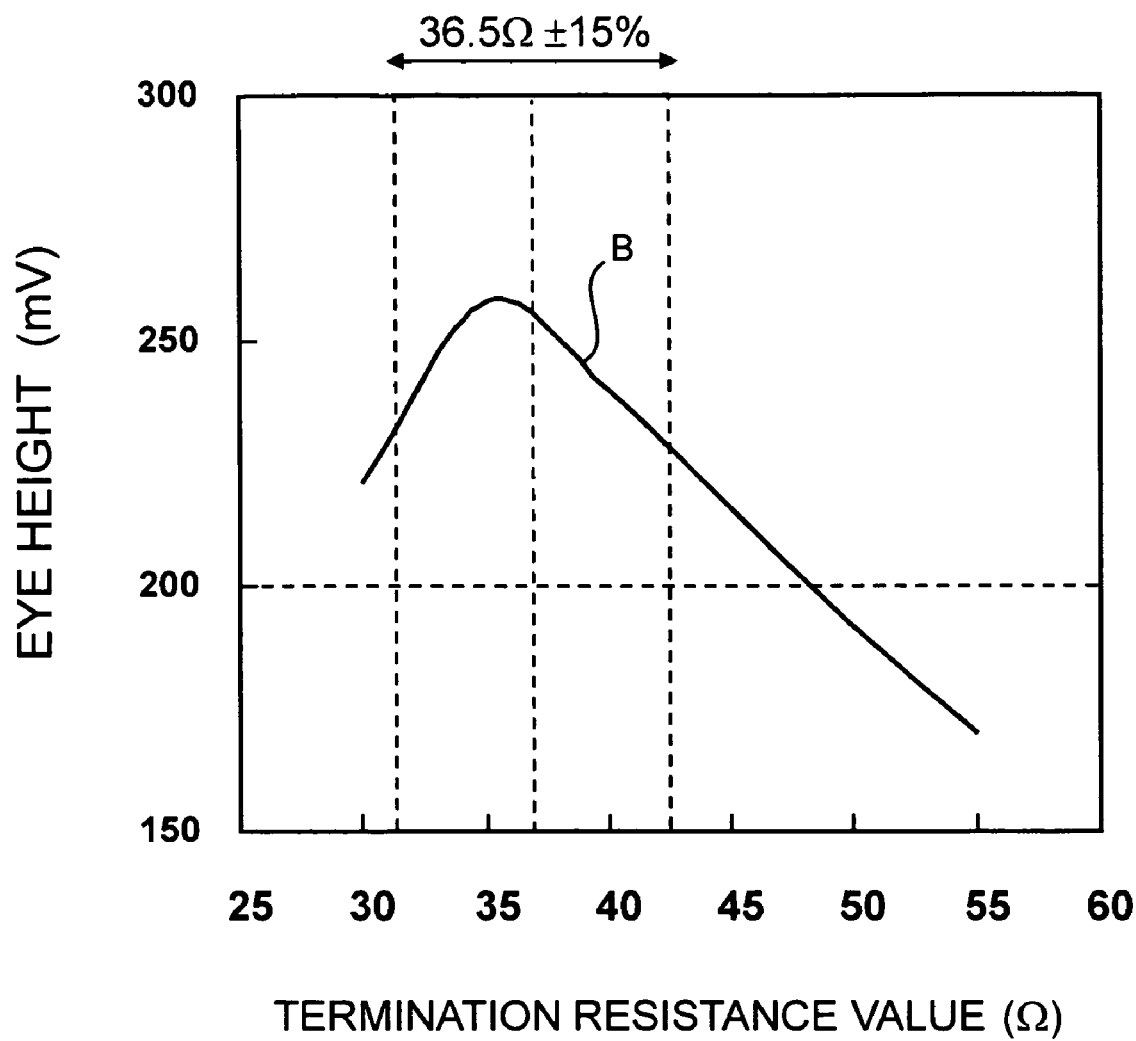
FIG. 11 is a graph showing a relationship between a termination resistance value and Eye Height in a pattern 7.

FIG. 11 is a graph showing a relationship between the termination resistance value and the Eye Height in the pattern 7. In the pattern 7, the impedance of the transmission line 301 is lower than the design value, and the impedance of the transmission line 302 is higher than the design value. In this case, an obtained characteristic matches the characteristic B shown in FIG. 15.

In such a pattern, the termination resistance value of the DRAM 202 is offset to a value (=36.5 Ω) lower than the design value. This is due to the fact that when the impedance mismatch shown in the pattern 7 occurs, if the termination resistance value is about 36.5 Ω, which is lower than the design value, the Eye Height reaches the maximum value. That is, the termination resistance value is offset to 36.5 Ω, anticipating such a characteristic fluctuation. Thereby, although the characteristic fluctuation caused by the impedance mismatch occurs, a high Eye Height can be obtained.

In this case, when the termination resistance value moves away from 36.5 Ω, the Eye Height decreases. However, within a range of ±15% that is a fluctuation width of the termination resistance value, a large value is sufficiently obtained. In contrast thereto, as shown in the characteristic B in FIG. 15, when the termination resistance value is set according to the design value, if the termination resistance value increases, the margin of the Eye Height greatly decreases. In the present embodiment, the termination resistance value is previously offset, and in doing so, such a problem is solved.

Figure 12:
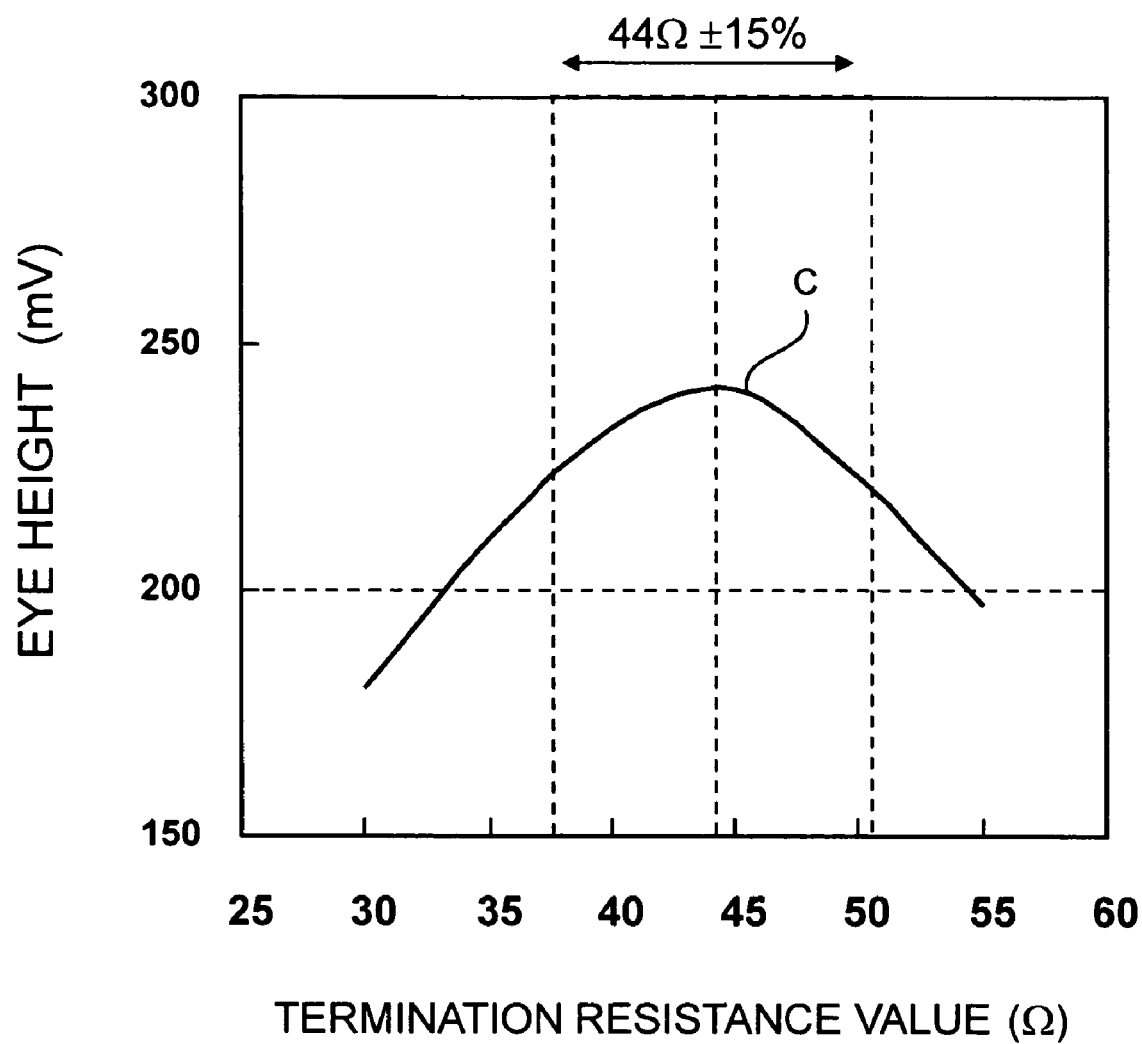
FIG. 12 is a graph showing a relationship between a termination resistance value and Eye Height in a pattern 3.

FIG. 12 is a graph showing a relationship between the termination resistance value and the Eye Height in the pattern 3. In the pattern 3, the impedance of the transmission line 301 is higher than the design value, and the impedance of the transmission line 302 is lower than the design value. In this case, an obtained characteristic matches a characteristic C shown in FIG. 15.

In such a pattern, the termination resistance value of the DRAM 202 is offset to a value higher than the design value (=44 Ω). This is due to the fact that when the impedance mismatch shown in the pattern 3 occurs, if the termination resistance value is about 44 Ω, which is higher than the design value, the Eye Height reaches the maximum value. That is, the termination resistance value is offset to 44 Ω, anticipating such a characteristic fluctuation. Thereby, although the characteristic fluctuation caused by the impedance mismatch occurs, a high Eye Height can be obtained.

In this case also, when the termination resistance value moves away from 44 Ω, the Eye Height decreases. However, within a range of ±15%, which is a fluctuation width of the termination resistance value, a large value is sufficiently obtained. In contrary thereto, as shown in the characteristic C in FIG. 15, when the termination resistance value is set according to the design value, if the termination resistance value is low, the margin of the Eye Height greatly decreases. In the present embodiment, the termination resistance value is previously offset, and in doing so, such a problem is solved.

Figure 13:
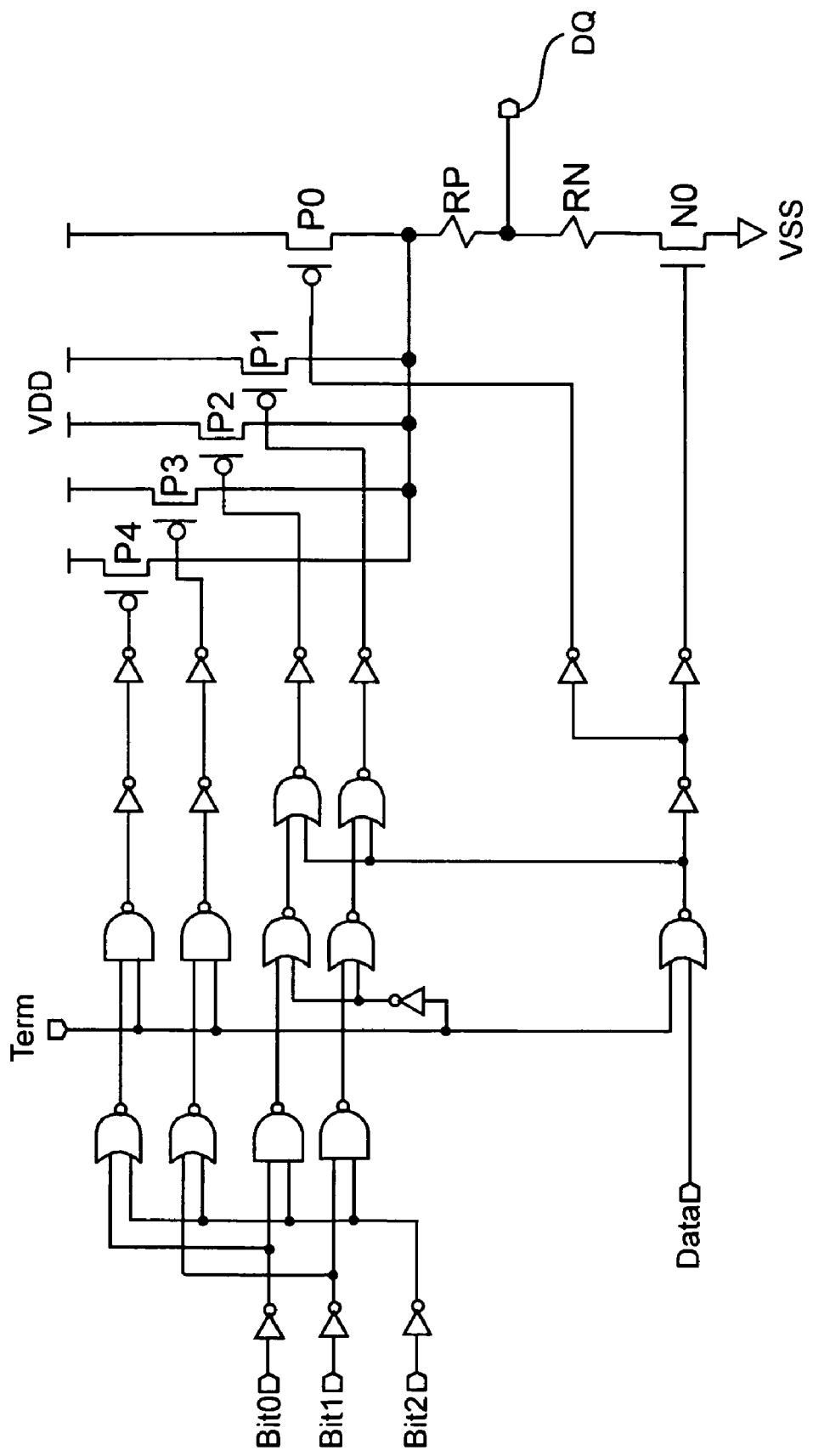
FIG. 13 is a circuit diagram showing an output unit of the input/output circuit included in each DRAM 200.

FIG. 13 is a circuit diagram showing an output unit of the input/output circuit included in each DRAM 200.

As shown in FIG. 13, between an input/output pin DQ and a power supply potential VDD, P-channel MOS transistors P0 to P4, which are connected in parallel, and a resistance RP are connected in series. Between the input/output pin DQ and a ground potential VSS, an N-channel MOS transistor N0 and a resistance RN are connected in series. ON/OFF of the transistors P0 to P4 and N0 are controlled by read data Data, a switching signal Term, and ODT impedance adjustment signals Bit2 to Bit0.

The output unit shown in FIG. 13 is able to perform both a read operation (output operation) and an ODT operation (VDD Termination). Switching these operations can be performed by the switching signal Term. More specifically, when the read operation is performed, the switching signal Term is set to L (low) level, and when the ODT operation is performed, the switching signal Term is set to H (high) level.

FIG. 14 is a truth table showing a relationship between logical levels of the various signals shown in FIG. 13 and the transistors P0 to P4 and N0 to be turned on.

As shown in FIG. 14, when the switching signal Term is at L level, the input/output pin DQ is driven to VDD or VSS depending on the logical level of the read data Data. More specifically, when the read data Data is at L level, the transistor N0 is turned on, and as a result, the input/output pin DQ is driven to L level. On the contrary, when the read data Data is at H level, the transistors P0 to P2 are turned on, and as a result, the input/output pin DQ is drive to H level. Thereby, the read data Data is outputted to outside. Such an operation is executed when the DRAM 200 is the On Rank DRAM. In this case, the ODT impedance adjustment signals Bit2 to Bit0 are invalidated.

On the other hand, when the DRAM 200 is the Off Rank DRAM, the switching signal Term is set to H level. In this case, the read data Data is invalidated, and according to the ODT impedance adjustment signals Bit2 to Bit0, a combination of the transistors P0 to P4 to be turned on is determined. The adjustment of the termination resistance value by the ODT impedance adjustment signals Bit2 to Bit0 is performed by setting to a mode register (not shown). Out of the ODT impedance adjustment signals Bit0 to Bit2, the Bit2 determines an adjustment direction of the termination resistance value. When the Bit2 is set to L level, the termination resistance value becomes high, and when the Bit2 is set to H level, the termination resistance value becomes low. The Bit1 and Bit0 determine an adjustment amount of the termination resistance value.

In an example shown in FIG. 14, when the termination resistance value is set according to the design value, the ODT impedance adjustment signals Bit2 to Bit0 are set to L, H, H, or H, L, L. In this case, the transistors P0 to P2 are turned on.

On the other hand, when the termination resistance value is set higher than the design value, the Bit2 is set to L level, and at least one of the Bit1 and Bit0 is set to L level. When the termination resistance value is set to maximum, all the Bit0 to Bit2 are set to L level. In this case, the transistor P0 only is turned on, and the impedance becomes the maximum. In contrary, when the termination resistance value is set lower than the design value, the Bit2 is set to L level, and at least one of the Bit1 and Bit0 is set to H level. When the termination resistance value is set to minimum, all the Bit0 to Bit2 are set to H level. In this case, all the transistors P0 to P4 are turned on, and the impedance becomes the minimum.

Although not particularly limited, the impedances of the transistors P0 to P4 are preferably applied weighting. According thereto, at the time of the ODT operation, the termination resistance value can be changed in a wider range and with a higher precision.

As described above, in the information processing system 100 according to the present embodiment, the impedance of the transmission line 301 is recorded in the BIOS 108, and the impedance of the transmission line 302 is recorded in the SPD chip 220. The match information of the impedances is supplied from the CPU 101 to the MCH 102, and based thereon, the termination resistance value of the DRAM 200 is optimized. Thus, the deterioration in signal quality resulting from the impedance mismatch can be reduced. As a result, the margin for the temperature change, the power voltage fluctuation or the like can be enlarged.

It is apparent that the present invention is not limited to the above embodiments, but may be modified and changed without departing from the scope and spirit of the invention.

In the above embodiment, as one example, based on the impedance match information between the transmission lines 301 and 302, the termination resistance value of the DRAM 200 is changed. However, in the present invention, as an action taken when the impedance mismatch is detected is not limited thereto. Accordingly, instead of changing the termination resistance value, the impedance of the MCH 102 or an output buffer of the On Rank DRAM can be changed. Further, according to a degree of the impedance mismatch, a clock frequency can be decreased.

Alternatively, instead of changing a circuit characteristic of the input/output circuit according to the impedance mismatch, the generation of the impedance mismatch can be informed to the user. To inform to the user, the graphic controller 105 shown in FIG. 1 can be used to display the generation on the display, for example. Thereby, the user becomes able to recognize the presence of the impedance mismatch, thereby allowing the user to perform a fundamental improvement such as exchanging the memory module 104.

In the present embodiment, the impedances of the transmission lines 301 and 302 are recorded in the BIOS 108 and the SPD chip 220, respectively. However, it is not requisite to store both of the two impedances, which are comparison targets. Accordingly, it suffices to store at least one of the two impedances, which are comparison targets. For example, rather than storing the impedance of the transmission line 301, only the impedance of the transmission line 302 can be stored in the SPD chip 220. In this case, with respect to the impedance of the transmission line 301, the design value can be used to make a comparison. Such a method is effective when the impedance variation in one of the transmission lines is small.

In the present embodiment, the two transmission lines, which are impedance comparison targets, are formed on the mother board 110 and the memory module 104, respectively. However, the present invention is not limited to this formation. For example, the transmission line 302 formed on the memory module 104 and the transmission line 304 formed within the package of the DRAM 200 can be the comparison targets. Alternatively, the transmission line 302 formed on the memory module 104 and the transmission line 303 formed in the socket 111 can be the comparison targets.

The number of transmission lines, which are comparison targets, is not limited to two. The impedances of three or more transmission lines can be compared. In this case, more detailed match information can be obtained, and thus a more effective action can be implemented.

In the present embodiment, the transmission lines formed on the substrates different from each other (the mother board 110 and the memory module 104) are comparison targets. However, the transmission lines formed on the same substrate can be the comparison targets. This configuration is effective in a case that a substrate area is large like a mother board and an in-plane variation is present in the impedance.

In the present embodiment, the measured impedance is stored in a nonvolatile memory such as a flash memory and an EEPROM. However, a method for storing the impedance is not limited thereto. A format of the data to be stored is not limited, either. An actual value of the impedance can be stored as it is. A deviation amount from the design value can be stored. Only the case number shown in FIG. 9 can be stored.

In the present embodiment, while the impedance is indirectly measured by a pattern capable of measuring it by the TDR method, the measurement method is not limited thereto. Therefore, the impedance of a target transmission line can be directly measured.

What is claimed is:

1. A signal transmission circuit comprising:
   first and second transmission lines connected to each other;
   a first impedance storage circuit storing an impedance of the first transmission line; and
   a control circuit that outputs match information between an impedance of the second transmission line and the impedance stored in the first impedance storage circuit,
   wherein the first transmission line is formed on a substrate on which a measurement pattern that is used to measure the impedance of the first transmission line is formed.

2. The signal transmission circuit as claimed in claim 1, further comprising a second impedance storage circuit storing the impedance of the second transmission line, wherein
   the match information outputted by the control circuit indicates a relationship between the impedance stored in the first impedance storage circuit and the impedance stored in the second impedance storage circuit.

3. The signal transmission circuit as claimed in claim 1, wherein the first transmission line and the second transmission line are formed on substrates different from each other.

4. The signal transmission circuit as claimed in claim 1, wherein the control circuit informs a user of the match information.

5. A signal transmission circuit comprising:
   first and second transmission lines connected to each other;
   a first impedance storage circuit storing an impedance of the first transmission line;
   a control circuit that outputs match information between an impedance of the second transmission line and the impedance stored in the first impedance storage circuit; and
   a semiconductor chip connected on a signal path including the first and second transmission lines, wherein
   the semiconductor chip includes an input/output circuit that inputs and outputs data via the signal path, and
   the control circuit supplies the match information to the semiconductor chip to change a circuit characteristic of the input/output circuit.

6. The signal transmission circuit as claimed in claim 5, wherein
   the input/output circuit includes a variable termination resistor circuit that changes a termination resistance value, and
   the control circuit supplies the match information to the semiconductor chip to change the termination resistance value of the variable termination resistor circuit.

7. The signal transmission circuit as claimed in claim 5, wherein the semiconductor chip is a semiconductor memory device.

8. The signal transmission circuit as claimed in claim 5, wherein
   the semiconductor chip is mounted on a module substrate,
   one of the first and second transmission lines is formed on the module substrate, and
   another one of the first and second transmission lines is formed on a mother board on which the module substrate is mounted.

9. The signal transmission circuit as claimed in claim 8, wherein the first impedance storage circuit is configured by a nonvolatile memory device mounted on the module substrate.

10. The signal transmission circuit as claimed in claim 5, further comprising a second impedance storage circuit storing the impedance of the second transmission line, wherein
    the match information outputted by the control circuit indicates a relationship between the impedance stored in the first impedance storage circuit and the impedance stored in the second impedance storage circuit.

11. The signal transmission circuit as claimed in claim 5, wherein the first transmission line and the second transmission line are formed on substrates different from each other.

12. The signal transmission circuit as claimed in claim 5, wherein the first transmission line is formed on a substrate on which a measurement pattern that is used to measure the impedance of the first transmission line is formed.

13. The signal transmission circuit as claimed in claim 5, wherein the control circuit informs a user of the match information.

14. The signal transmission circuit as claimed in claim 6, wherein the semiconductor chip is a semiconductor memory device.

15. The signal transmission circuit as claimed in claim 6, wherein the semiconductor chip is mounted on a module substrate, one of the first and second transmission lines is formed on the module substrate, and another one of the first and second transmission lines is formed on a mother board on which the module substrate is mounted.

16. The signal transmission circuit as claimed in claim 15, wherein the first impedance storage circuit is configured by a nonvolatile memory device mounted on the module substrate.

17. A memory module comprising:

a module substrate;

a plurality of semiconductor memory devices mounted on the module substrate;

a nonvolatile memory device in which information about the semiconductor memory devices are stored; and a transmission line formed on the module substrate and connected at least to the semiconductor memory devices, wherein the nonvolatile memory device stores information about an impedance of the transmission line.

18. The memory module as claimed in claim 17, further comprising a measurement pattern formed on the module substrate to measure the impedance of the transmission line.

19. The memory module as claimed in claim 17, wherein the semiconductor memory devices include an ODT function.

20. A manufacturing method of a circuit board, comprising:

forming a transmission line and a measurement pattern that is used to measure an impedance of the transmission line on a substrate;

measuring the impedance of the transmission line by using the measurement pattern; and recording the measured impedance in a nonvolatile memory device mounted on the substrate.

* * * * *